United States Patent
Tyrrell et al.

(10) Patent No.: US 8,130,022 B2
(45) Date of Patent: Mar. 6, 2012

(54) ULTRA-LOW CURRENT PUSH-BUTTON SWITCH INTERFACE CIRCUIT

(75) Inventors: Julian Tyrrell, Swindon (GB); David Clewett, Swindon (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 869 days.

(21) Appl. No.: 12/215,801

(22) Filed: Jun. 30, 2008

(65) Prior Publication Data

US 2009/0315410 A1      Dec. 24, 2009

(30) Foreign Application Priority Data

Jun. 23, 2008   (EP) .................................... 08392007

(51) Int. Cl.
*H03K 17/687*      (2006.01)
(52) U.S. Cl. ........................ 327/427; 327/518
(58) Field of Classification Search .................. 327/427, 327/376, 377, 387, 518
See application file for complete search history.

(56) References Cited

U.S. PATENT DOCUMENTS

| | | | |
|---|---|---|---|
| 3,986,039 A | 10/1976 | Bovitz | |
| 5,523,633 A | 6/1996 | Imaizumi et al. | |
| 5,729,167 A | 3/1998 | Kujawa et al. | |
| 5,920,227 A * | 7/1999 | An | 327/544 |
| 6,052,005 A | 4/2000 | Braun | |
| 6,313,690 B1 * | 11/2001 | Ohshima | 327/427 |
| 6,861,955 B2 * | 3/2005 | Youssef | 340/635 |
| 6,909,313 B2 * | 6/2005 | Youssef | 327/147 |
| 7,176,588 B2 | 2/2007 | Yahagi et al. | |
| 7,463,072 B2 * | 12/2008 | Kim et al. | 327/112 |
| 7,683,687 B2 * | 3/2010 | Kawashima et al. | 327/206 |
| 7,692,475 B2 * | 4/2010 | Tsai et al. | 327/427 |

FOREIGN PATENT DOCUMENTS

EP      08392007.4-1233      12/2008

* cited by examiner

*Primary Examiner* — Hai L Nguyen

(74) *Attorney, Agent, or Firm* — Saile Ackerman LLC; Stephen B. Ackerman

(57) ABSTRACT

Circuits and methods to achieve a switch interface circuit for a single pole, single throw (SPST) momentary push-button switch consuming a few tens of nanoamps whilst the push-button switch is closed, having low impedance input path when the switch is open in order to eliminate RFI interference have been achieved. The two states of the push-button switch, open and closed, maintain a low impedance path to one of the power supplies. The supply current is zero when the switch is open and is minimized whilst the switch is closed. The asynchronous edge triggered detection of the switch event allows an extended switch open to closed transition operation.

11 Claims, 1 Drawing Sheet ern on-chip circuitry.

ULTRA-LOW CURRENT PUSH-BUTTON SWITCH INTERFACE CIRCUIT

BACKGROUND OF THE INVENTION (1) Field of the Invention

This invention relates generally to the field of switch interface circuits and relates more specifically to switch interface circuits consuming minimal power.

(2) Description of the Prior Art

Especially in mobile applications powered by batteries, electromechanical switch operations must only consume minimal power, while maintaining a reliable operation. This is most important for e.g. switches used with smart card applications. In these kind of applications a minimum current drain from a battery is required already during assembly in order to minimize energy loss.

The challenge for the designers of such switch interface circuits is to achieve a system consuming current in the order of magnitude of a few tens of nanoamps whilst the switch is closed, having a minimum impedance when the switch is open to eliminate RFI (Radio Frequency Induced) interference, and to allow for extended switch-closed operation.

There are known patents or patent publications dealing with switch interface circuits:

U.S. Patent (U.S. Pat. No. 5,729,167 to Kujawa et al) discloses a low power consumption switch interface circuit including a current source for providing switch current having a magnitude dependent on a state of a current range signal. An input terminal is provided to conduct the switch current to an external switch. A circuit for detecting a signal present at the input terminal provides a measured pulse when the signal is detected. A current range selector, coupled to the current source, outputs a first state of the current range signal while the measured pulse is outputted from the circuit, and a second state of the current range signal while the measured pulse is not outputted from the circuit. The current source provides the switch current at a first magnitude responsive to the first state of the current range signal, and a second magnitude responsive to the second state of the current range signal.

U.S. Patent (U.S. Pat. No. 6,052,005 to Braun) proposes a low current drain switch interface circuit including an input terminal, coupled to a first terminal of a diode. A voltage follower circuit is coupled to a second terminal of the diode. A current source is coupled between an output terminal of the voltage follower circuit and a power supply terminal. A mechanical switch is coupled to the input terminal. The voltage follower circuit outputs a voltage indicative of a physical state of the mechanical switch.

U.S. Patent (U.S. Pat. No. 3,986,039 to Bovitz) discloses a toggle switch indicator circuit for use with digital logic circuits which may be manually set and cleared by means of a manually operated push-button switch and which incorporates a debounce network and an indicator for displaying the state of the toggle switch at a remote point.

U.S. Patent (U.S. Pat. No. 7,176,588 to Yahagi) discloses a starter drive device which drives a starter motor by, upon actuation of a starter switch, turning a starter relay ON and OFF via an electronic control device, wherein the electronic control device includes: an interface circuit; a power source control circuit; a calculation device and a delay circuit; a buffer; an addition circuit; a latch circuit; a first pull up circuit; a second pull up circuit; and wherein, if the power source control circuit has detected a drop of voltage of the power source when the starter motor is being driven, along with stopping the calculation device, the buffer disconnects the calculation device from the latch circuit, and controls the starter relay by operating the driver circuit via the latch circuit based upon the signals from the interface circuit and the second pull up circuit.

SUMMARY OF THE INVENTION

A principal object of the present invention is to achieve methods and systems for switch interface circuits for a push-button switch, maintaining a low impedance path to one of the power supplies and having a minimized supply current whilst the switch is closed.

A further object of the present invention is to allow for extended switch-closed operation by an edge triggered detection of the switch event.

In accordance with the objects of this invention a method to achieve switch interface circuits consuming a few tens of nanoamps whilst a push-button switch is closed, having low impedance input when the switch is open in order to eliminate RFI interference, and to allow for extended switch-closed operation have been disclosed. The method invented is comprising the steps of (1) providing a push-button switch, an inverting comparator circuit having an hysteresis, an inverting amplifier, a means of an edge-triggered switching device, a first resistive element having a resistance in the order of tens of MΩ, and a second resistive element having a resistance in the order of kΩ, being activated by a transistor switch, (2) setting the supply current to zero whilst the switch is open, and (3) reducing input impedance by said second resistance element activated by said transistor switch whilst the switch is open, and (4) using edge-triggered detection of the push-button switch event in order to allow for extended switch-closed operation.

In accordance with the objects of this invention a system to achieve a switch interface circuit consuming a few tens of nanoamps, whilst a push-button switch is closed, having low impedance input when the switch is open in order to eliminate RFI interference, and to allow for extended switch-closed operation is comprising a push-button switch having a first terminal connected to a positive supply, wherein its second terminal is connected to an input of an inverting comparator circuit having hysteresis, to a first terminal of a first resistive element and to a first terminal of a second resistive element, said positive and a negative supply voltage, said first resistive element having its second terminal connected to the negative supply voltage, and said second resistive element having its second terminal connected to a drain of an NMOS transistor. Furthermore the system invented comprises said NMOS transistor having its source connected to the negative supply voltage and its gate connected to an output of said inverting comparator circuit, a logic inverter having its input connected to the output of said inverting comparator and having its output connected to a clock input of a D-type flip-flop, and said D-type flip-flop wherein its output is the output of said switch output circuit and its data input is always at a logical "1" state.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and systems to achieve a SPST (single pole, single throw) momentary push button switch to generate a digital output. The two states of the button, open and closed, maintain a low impedance path to one of the power supplies; and the supply current is minimized whilst the switch is closed.

The switch interface circuit of the present invention is consuming a few tens of nanoamps whilst a push-button switch is closed, having low impedance input when the switch is open in order to eliminate RFI interference, and allows for extended switch-closed operation.

In a preferred embodiment of the invention the system invented is applied to a membrane switch as found in a smart card. It is obvious the invention can be applied for a multitude of other switching applications.

Figure 1:
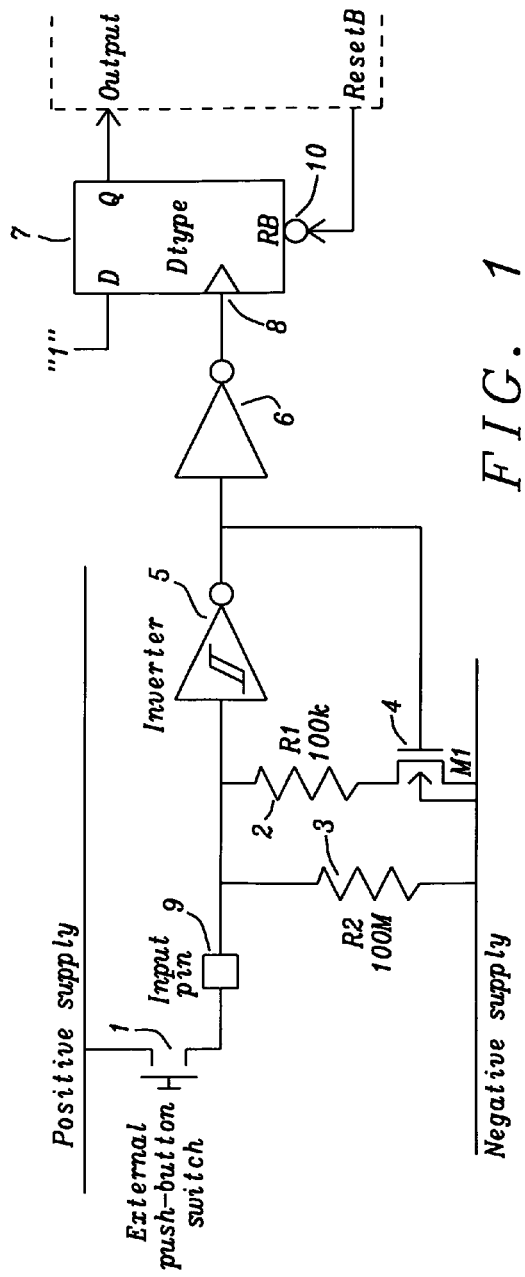
FIG. 1 illustrates a circuit diagram showing an external push-button switch and the associated on-chip-circuitry.

FIG. 1 illustrates a circuit diagram showing an external push-button switch and the associated on-chip-circuitry. The circuit has a positive and a negative supply voltage. Furthermore the circuit comprises a push-button switch 1, a first resistor R1 2, a second resistor R2 3, an NMOS transistor M1 4, a Schmitt trigger inverter 5, a logic inverter 6, and a D type flip-flop 7. Other inverting comparator circuits having hysteresis could also be used instead of the Schmitt trigger inverter 5.

In the preferred embodiment the state of the "D" input of the D-type flip-flop 7 is always a logical "1". The Q output of the flip-flop 7 always takes on the state of the "D" input at the moment of a rising clock edge at the input port 8 of the flip-flop 7, and never at any other time. The output Q is input to an on-chip digital controller which, after performing an action when Q goes to a logic 1, can issue a RESET signal to set Q back to logic 0.

In the preferred embodiment all components shown in FIG. 1, except the push-button switch, are integrated in an ASIC. The push-button switch 1 is connected via the input pin 9 to this ASIC. It is obvious that the circuit shown could be realized outside an ASIC as well. The interface uses an edge triggered operation of the switch, which allows the internal processing to complete, then power down irrespective of the continuing switch status. During the manufacture of the smart card the switch is pressed for a significant period of time during the thermo-compression assembly of the plastic.

The requirement is for a minimum current drain from the battery during assembly to minimize the energy loss.

The operation of the switch interface circuit has two static states, namely switch open and switch closed, and two transition states, namely open-to-closed and closed-to-open.

The output of the switch interface circuit is provided from the positive edge-triggered D-type flip-flop 7, or equivalent function, which captures the action of the push-button switch 1 closing. It should be noted that alternatively a state machine or any clocked register logic could be deployed instead of the D-type flip-flop 7.

The state of the output can be cleared by the internal processing logic of the circuit invented at any time by the asynchronous reset 10. This allows the internal processing logic to react to the switch closing event and complete its action by clearing the D-type flip-flop 7 irrespective of the switch status; the output of the switch interface circuit is triggered by the open-to-close transition of the switch and not by its continuous static closed state nor the closed-to-open transition of the switch.

Figure 2:
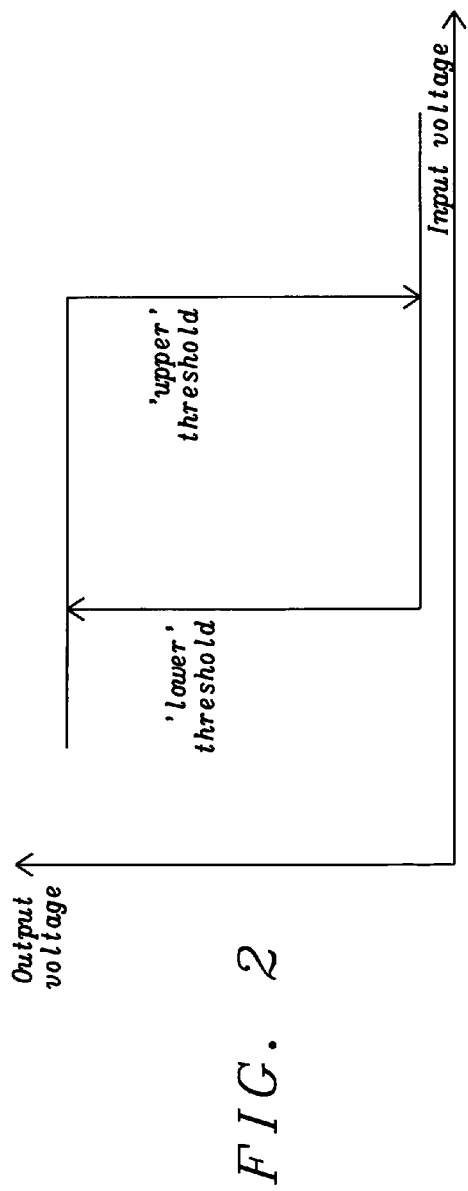
FIG. 2 shows the operation of a Schmitt trigger inverter.

FIG. 2 shows the operation of the Schmitt trigger inverter 5, it should be noted that any inverting function with an hysteresis can be used alternatively. The diagram shows that, due to the inverting function, the output is high, when the input is lower than a certain chosen threshold, when the input is higher than another (higher) chosen threshold, the output is low; when the input is between the two threshold values, the output retains its value. The output retains its value until the input changes sufficiently to trigger a change. This dual threshold action implies that the Schmitt inverter has some memory.

The four switch conditions are listed below. Logic states are referred to as "high" or "1", and "low" or "0".

1. Static State—Switch Open

Whilst the switch is open, the input to the Schmitt trigger inverter 5 is low, pulled down by both resistors R1 2 and R2 3, which makes the output high (turning on the NMOS transistor M1 4 in series with R1 2). In a preferred embodiment resistor R1 2 has a resistance of 100 kΩ (other resistance values in this order of magnitude are possible also), thus providing 100 kΩ impedance to the negative supply on the input pin 9, so reducing any RFI pick-up and any spurious operation. In this state the supply current is zero.

2. Static State—Switch Closed

When the push-button switch 1 is closed, the input to the Schmitt trigger inverter 5 is pulled high; this switches off the NMOS transistor M1 4 in series with resistor R1 2. The low impedance of the closed switch 1 reduces any RFI pick-up and any spurious operation. In this state there is a current path through the closed switch 1 and resistor R2 3, taking a minimal current from the supply due to the very high value of resistor R2 3; for example with a 3 V supply and R2 3 having a resistance of 100 MΩ the current would be 30 nA.

3. Transition State—Switch Open-to-closed

When the push-button switch 1 is closed, the input to the Schmitt trigger inverter 5 is pulled high and its output is pulled low; this requires the switch 1 to have a contact resistance significantly lower than 100 kΩ. When the voltage exceeds the upper threshold of the Schmitt inverter 5 its low output switches off the NMOS transistor M1 4 in series with resistor R1 2; this leaves a current path through the closed switch 1 and resistor R2 3, taking a minimal current from the supply due to the very high resistance value of resistor R2 3 (e.g. 100 MΩ), i.e. the transition from open to closed is sensed asynchronously any time the switch is closed. The output of the Schmitt trigger inverter 5, is inverted by the logic inverter 6, which clocks the D-type flip-flop 7; causing the output to go to a "1".

4. Transition State—Switch Closed-to-open

When switch 1 is opened, the input of the Schmitt trigger inverter 5 is slowly pulled low by resistor R2 3 until the lower threshold of the Schmitt trigger inverter 5 is reached, which turns ON the NMOS transistor M1 4 and switching resistor R1 2 into circuit. The additional resistance of resistor R1 2 quickly pulls the input low and into the static open state.

The high resistance of resistive element R2 3 is not critical in value. The requirement for R2 3 is that it must overcome any leakage current and pull the input low. The implementation of resistive element R2 3 depends upon the process technology: resistive poly-silicon, diffusion, MOS devices, current source, etc.

In summary, the key features of the present invention are:
1. The ultra-low power consumption in the order of magnitude of a few tens of nanoamps whilst the push-button switch is closed.
2. The low input impedance when the switch is open in order to eliminate RFI interference.
3. The edge triggered detection of the switching event to allow for extended switch-closed operation.

While the invention has been particularly shown and described with reference to the preferred embodiments thereof, it will be understood by those skilled in the art that various changes in form and details may be made without departing from the spirit and scope of the invention.

What is claimed is:

1. A system to achieve a switch interface circuit consuming a few tens of nanoamps, whilst a push-button switch is closed, having low impedance input when the switch is open in order to eliminate RFI interference, and to allow for extended switch-closed operation is comprising:
   a push-button switch having a first terminal connected to a positive supply, wherein its second terminal is connected to an input of a Schmitt trigger inverter having hysteresis, to a first terminal of a first resistive element and to a first terminal of a second resistive element;
   said positive and a negative supply voltage;
   said first resistive element wherein its resistance is in the order of M$\Omega$s, having its second terminal connected to the negative supply voltage;
   said second resistive element wherein its resistance is in the order of k$\Omega$s, having its second terminal connected to a drain of an NMOS transistor;
   said NMOS transistor having its source connected to the negative supply voltage and its gate connected to an output of said Schmitt trigger inverter enabling to sense asynchronously any time a switch transition from open to close;
   said Schmitt trigger inverter;
   one logic inverter having its input connected to the output of said Schmitt trigger inverter and having its output connected to a clock input of a D-type flip-flop; and
   said D-type flip-flop wherein its output is the output of said switch output circuit and its data input is always at a logical "1" state.

2. The system of claim 1 wherein said push-button switch is a membrane switch.

3. The system of claim 1 wherein said switch is single pole, single throw momentary push-button switch.

4. The system of claim 1 wherein said D-type flip-flop is replaced by a state machine.

5. The system of claim 1 wherein said D-type flip-flop is replaced by a clocked register logic circuit.

6. The system of claim 1 wherein all components of the system except the push-button switch are integrated in an ASIC.

7. The system of claim 6 wherein said ASIC is integrated in a smart card.

8. The system of claim 7 wherein during the manufacture of the smart card the switch is pressed for a significant period of time during the thermo-compression assembly of the plastic.

9. A method to achieve switch interface circuits consuming a few tens of nanoamps whilst a push-button switch is closed, having low impedance input when the switch is open in order to eliminate RFI interference, and to allow for extended-time switch-closed operation is comprising the following steps:
   (1) providing a push-button switch, which is normally open, a Schmitt trigger inverter having hysteresis, one inverting amplifier, a means of an edge-triggered switching device, a first resistive element having a resistance in the order of tens of M$\Omega$, and a second resistive element having a resistance in the order of k$\Omega$, being activated by a transistor switch;
   (2) setting the supply current to zero whilst the push-button switch is open;
   (3) reducing input impedance by said second resistance element activated by said transistor switch whilst the switch is open; and
   (4) using edge-triggered detection of the push-button switch event in order to sense asynchronously an open to close switch transition.

10. The method of claim 9 wherein said means of an edge-triggered switching device is a D-type flip-flop.

11. The method of claim 9 wherein the output voltage of said Schmitt trigger inverter is controlling said transistor switch.

* * * * *